(12) United States Patent
Kim

(10) Patent No.: US 9,349,783 B2
(45) Date of Patent: May 24, 2016

(54) DISPLAY DEVICE

(71) Applicant: SAMSUNG DISPLAY CO., LTD., Yongin, Gyeonggi-Do (KR)

(72) Inventor: Keum Nam Kim, Seoul (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 1 day.

(21) Appl. No.: 14/296,509

(22) Filed: Jun. 5, 2014

(65) Prior Publication Data

US 2015/0041776 A1   Feb. 12, 2015

(30) Foreign Application Priority Data

Aug. 6, 2013  (KR) .......................... 10-2013-0093236

(51) Int. Cl.
*G09G 3/32* (2006.01)
*H01L 27/32* (2006.01)

(52) U.S. Cl.
CPC .......... *H01L 27/3276* (2013.01); *G09G 3/3233* (2013.01); *G09G 2300/0852* (2013.01); *G09G 2300/0861* (2013.01)

(58) Field of Classification Search
CPC .. G09G 3/3291; G09G 3/3266; G09G 3/3659
See application file for complete search history.

(56) References Cited

U.S. PATENT DOCUMENTS

| 7,852,446 | B2 | 12/2010 | Kim | |
|---|---|---|---|---|
| 8,111,366 | B2 | 2/2012 | Kim | |
| 2010/0253708 | A1* | 10/2010 | Kasai | ............................ 345/690 |
| 2011/0025671 | A1 | 2/2011 | Lee | |
| 2013/0128015 | A1* | 5/2013 | Sung et al. | ....................... 348/55 |
| 2014/0035798 | A1* | 2/2014 | Kawada et al. | .................. 345/77 |
| 2014/0043372 | A1* | 2/2014 | Xi et al. | ......................... 345/690 |

FOREIGN PATENT DOCUMENTS

| JP | 2010-243610 | 10/2010 |
|---|---|---|
| KR | 10-2008-0014331 | 2/2008 |
| KR | 10-2013-0017735 | 2/2013 |

\* cited by examiner

*Primary Examiner* — Thomas L Dickey
(74) *Attorney, Agent, or Firm* — Lee & Morse, P.C.

(57) ABSTRACT

A display device includes at least two subpixels arranged in a first direction, a first data line connected to a first subpixel of the two subpixels, and a second data line connected to a second subpixel of the two subpixels. The first data line is arranged at a first side of the two subpixels and the second data line is arranged at a second side of the two subpixels. The first and second sides are opposing sides relative to the first and second subpixels.

20 Claims, 5 Drawing Sheets

DISPLAY DEVICE

CROSS-REFERENCE TO RELATED APPLICATION

Korean Patent Application No. 10-2013-0093236, filed on Aug. 6, 2013, and entitled, "Display Device," is incorporated by reference herein in its entirety.

BACKGROUND

1. Field

One or more embodiments described herein relate to a display device.

2. Description of the Related Art

A display device emits light from a plurality of pixels to form an image. The light is emitted based on data signals which are written in synchronization with scanning signals. In some circumstance, a capacitor (e.g., parasitic capacitance) may be formed between adjacent data lines which causes interference.

SUMMARY

In accordance with one embodiment, a display device includes at least two subpixels arranged in a first direction; a first data line connected to a first subpixel of the two subpixels; and a second data line connected to a second subpixel of the two subpixels, wherein the first data line is arranged at a first side of the two subpixels and the second data line is arranged at a second side of the two subpixels and wherein the first and second sides are opposing sides relative to the first and second subpixels.

The display device may include a first scanning line between the first and second subpixels in a second direction perpendicular to the first direction. The display device may include a first wiring extending in the first direction and connected to the first scanning line, wherein the first wiring forms a gate of a switching transistor of the first subpixel.

A second wiring may extend in the first direction and may be connected to the first scanning line, wherein the second wiring forms a gate of a switching transistor of the second subpixel. The first wiring and second wiring may be positioned in a diagonal direction.

The display device may include a second scanning line between the first and second subpixels in a second direction perpendicular to the first direction. The display device may include a first wiring extending in the first direction and connected to the scanning line; and a second wiring extending in the first direction and connected to the another scanning line.

Each of the first and second subpixels may include an organic light emitting diode; a driving transistor to supply current to the organic light emitting diode; a switching transistor having one end connected to the first data line; and a second capacitor between a first electrode connected to another end of the switching transistor and a second electrode receiving a power supply voltage.

Each of the first and second subpixels may include a first capacitor between the first electrode and a third electrode connected to a gate of the driving transistor. Each of the first and second subpixels may includes a compensation transistor to compensate for a threshold voltage of the driving transistor; and a compensation control line connected to a gate of the compensation transistor.

In accordance with another embodiment, a display apparatus includes a first subpixel; a second subpixel adjacent the first subpixel; a first signal line on a first side of the first and second subpixels; and a second signal line on a second side of the first and second subpixels, wherein the first and second sides are opposing sides relative to the first and second subpixels and wherein the first signal line is coupled to the first subpixel but not the second subpixel and the second signal line is coupled to the second subpixel but not the first subpixel. The first and second signal lines may be data lines.

The display apparatus may include a control line coupled to the first and second subpixels. The control line may be a scanning line. The control line may extend between the first and second subpixels.

In accordance with another embodiment, a display device includes a first column of pixels; a second column of pixels adjacent the first column; and N data lines extending between the first and second columns, wherein each pixel in the first column includes M subpixels, and the subpixels in adjacent pixels in the first column are coupled to a signal line, wherein each pixel in the second column includes M subpixels, and the subpixels in adjacent pixels in the second column are coupled to the signal line, and wherein the subpixels in a first one of the adjacent pixels in the first column are coupled to a respective number of the data lines between the first and second columns, and the subpixels in a second one of the adjacent pixels in the second column are coupled to a respective number of the data lines between the first and second columns.

The subpixels in the first one of the adjacent pixels in the first column may be arranged diagonally relative to the subpixels in the second one of the adjacent pixels in the second column. The subpixels in a first one of the adjacent pixels in the second column may not be coupled to any of the N data lines. In one embodiment, N may equal 2M. The signal line may be a scan line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
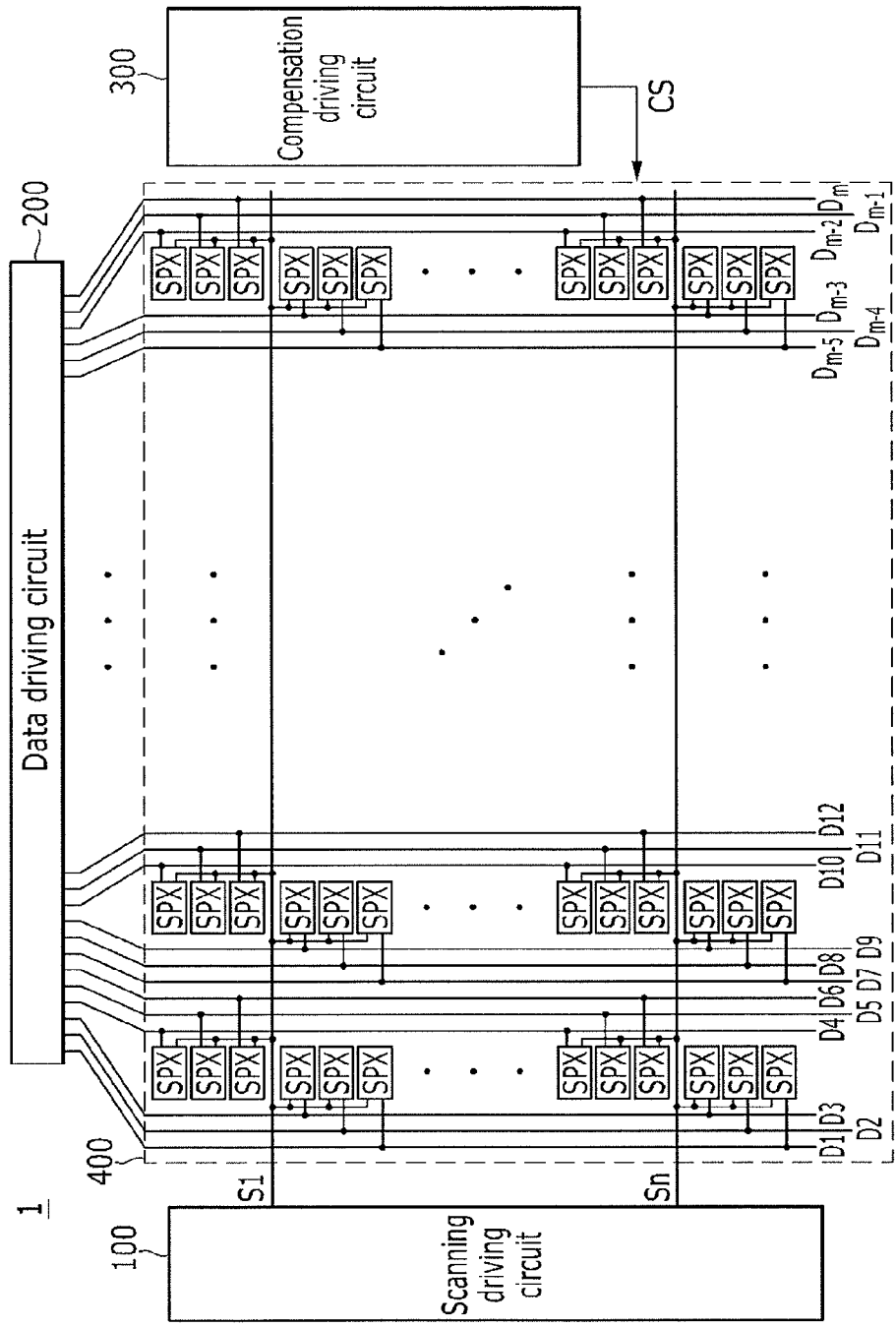
FIG. 1 illustrates an embodiment of a display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a display device 1 which includes a scanning driving circuit 100, a data driving circuit 200, a compensation driving circuit 300, and a display unit 400. The display unit 400 includes a plurality of scanning lines S1 to Sn, a plurality of data lines D1 to Dm, and a plurality of subpixels SPX. In addition, wiring may be included for transmitting a compensation control signal CS from compensation control circuit 300, for supplying a power supply voltage ELVDD, and for supplying a power supply voltage ELVSS. These wirings may be connected to all the subpixels SPX.

The scanning lines S1 to Sn are arranged in a vertical direction, and each of the scanning lines S1 to Sn is formed to extend in a horizontal direction. The data lines D1 to Dm are arranged in a horizontal direction, and each of the data lines D1 to Dm is formed in a vertical direction. Each of the subpixels SPX is connected to a corresponding one of the scanning line S1 to Sn and a corresponding one of the data lines D1 to Dm.

The scanning driving circuit 100 supplies scanning signals S[1] to S[n] to respective ones of the scanning lines S1 to Sn. Data driving unit 200 generates data signals (e.g., data voltages) according to input image data, and supplies the data signals to respective ones of data lines D1 to Dm. The compensation driving circuit 300 generates and supplies a compensation control signal CS to the subpixels SPX. The compensation control signal CS turns on a compensation transistor T3 between a gate and drain of a driving transistor T1 (FIG. 2) in each subpixel, in order to compensate for a variation in threshold voltage of the driving transistor T1 in the subpixel.

Each subpixel SPX compensates for variation in threshold voltage of the driving transistor T1 based on compensation control signal CS. Each subpixel receives a data signal from a corresponding data line in synchronization with one of the scanning signals. The data signal is written to the subpixel SPX, and a driving current based on the written data signal is supplied to an organic light emitting diode serving as a light emitting device.

In one embodiment, a plurality of data lines are arranged on respective sides of one subpixel column. Six subpixels SPX are arranged in the vertical direction, and receive data signals from corresponding data lines according to one scanning signal.

Figure 2:
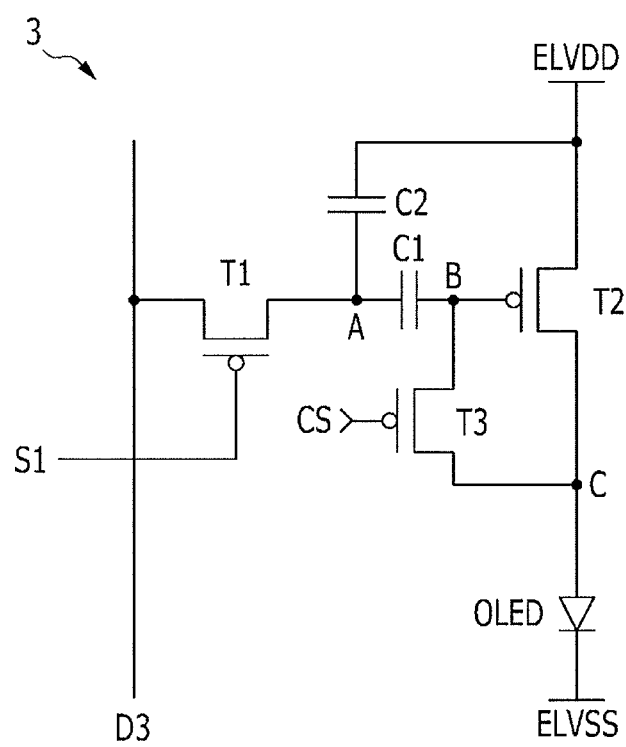
FIG. 2 illustrates an embodiment of a subpixel.

FIG. 2 illustrates an embodiment of a subpixel 3, which, for example, may correspond to the subpixels in FIG. 1. In this embodiment, subpixel 3 is connected to data line D3 and scanning line S1.

Referring to FIG. 2, subpixel 3 includes a switching transistor T1, a driving transistor T2, a compensation transistor T3, a first capacitor C1, and a second capacitor C2. Switching transistor T1 includes one end connected to data line D3, a gate connected to scanning line S1, and another end connected to node A.

Driving transistor T2 includes a gate connected to node B, a source connected to power supply voltage ELVDD, and a drain connected to an anode (node C) of an organic light emitting diode (OELD).

Compensation transistor T3 includes respective ends connected between the gate (node B) and drain (node C) of driving transistor T2, and a gate configured to receive compensation control signal CS.

First capacitor C1 includes respective electrodes connected between nodes A and B. Second capacitor C2 includes one electrode connected to node A and another electrode connected to power supply voltage ELVDD. The OLED is connected between node C and power supply voltage ELVSS.

The power supply voltage ELVDD and power supply voltage ELVSS supply a driving voltage required for operation of the subpixel. The power supply voltage ELVDD and power supply voltage ELVSS supply a driving voltage when driving transistor T2 and OLED are to operate in each of a reset period, a compensation period, a scanning period, and a light emission period.

During the reset period, power supply voltage ELVSS is at a high level and power supply voltage ELVDD is at a low level. During the reset period, an anode voltage of the OLED is connected to power supply voltage ELVDD at a low level, and charges stored in the OLED are discharged.

During the compensation period, control signal CS is at a low level and compensation transistor T3 is turned on and diode-connected to driving transistor T2. Thus, a voltage obtained by subtracting a threshold voltage of driving transistor T2 from power supply voltage ELVDD is supplied to the gate electrode of driving transistor T2. At this time, a charge corresponding to voltage ELVDD-VTH obtained by subtracting threshold voltage VTH of driving transistor T2 from power supply voltage ELVDD is stored in first capacitor C1.

During the scanning period, a plurality of scanning signals transmitted to the scanning lines S1 to Sn are sequentially set to a low level. The switching transistor T1 is turned on in response to the scanning signal transmitted to scanning line S1. While switching transistor T1 is turned on, the data signal supplied along the data line is transmitted to node A.

When the emission period is stated, power supply voltage ELVDD rises to a high level. The voltage of node A and gate voltage of driving transistor T2 rise according to a coupling operation between first and second capacitors C1 and C2. The driving current based on the rising voltage flows from driving transistor T2 to the OLED.

Figure 3:
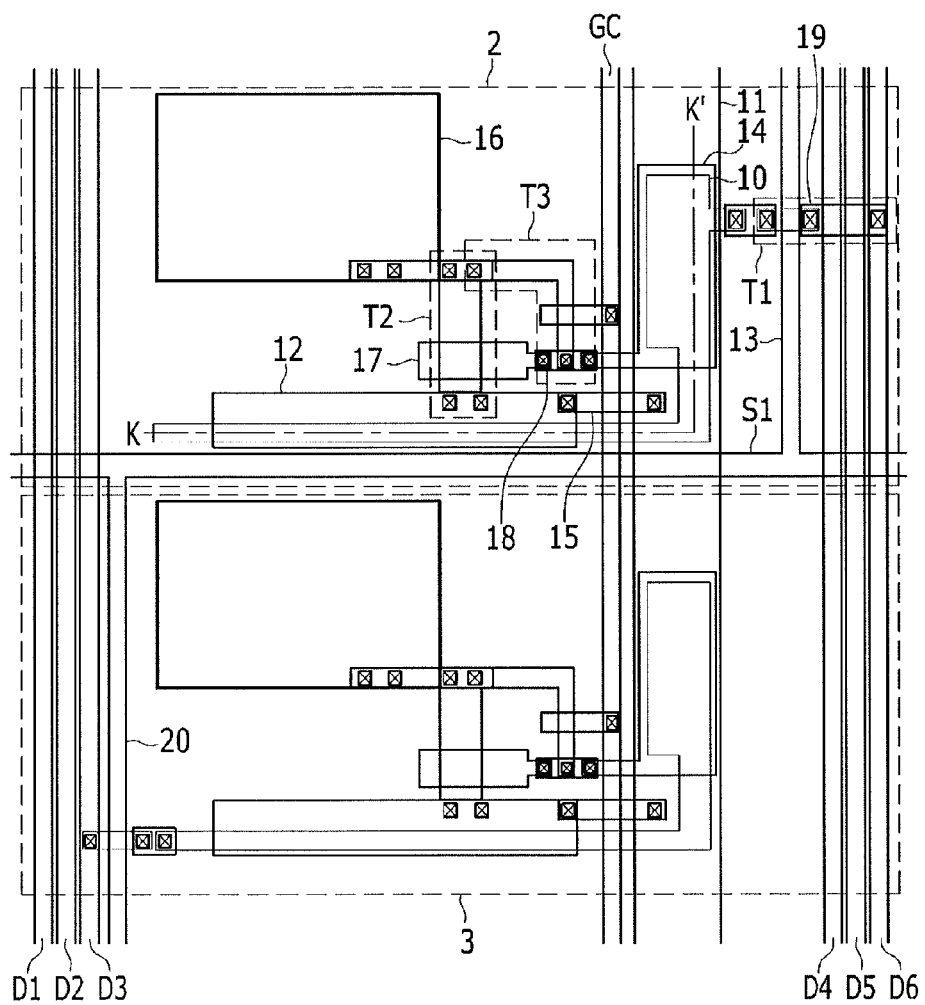
FIG. 3 illustrates a layout of subpixels, scanning lines, and data lines.

FIG. 3 illustrates an example of a layout of subpixels, scanning lines, and data lines. This layout includes subpixels 2 and 3, and illustrates the scanning lines and data lines arranged between subpixels 2 and 3. Also, in this embodiment, subpixel 2 may have a same structure as subpixel 3, including switching transistor T1, driving transistor T2, and compensation transistor T3.

Wiring GC transmits compensation control signal CS. Wiring 11 transmits power supply voltage ELVDD. Scanning line S1 is in a horizontal direction and wirings 13 and 20 are in a vertical direction. The scanning signal is transmitted to three subpixels SPX at the upper side of scanning line S1 through wiring 13, and three subpixels SPX at the lower side of scanning line S1 through wiring 20.

One end of switching transistor T1 is connected to data line D6 through a contact hole and an electrode 19. Another end of switching transistor T1 is connected to an electrode 10 through a contact hole. Electrode 10 is one of the components connected to node A in FIG. 2. Wiring 13 serves as a gate of switching transistor T1.

The source of driving transistor T2 is connected to an electrode 12 through a contact hole. The electrode 12 is connected to wiring 11 through a contact hole and an electrode 15. The drain of driving transistor T2 is connected to an anode electrode 16 of the OLED through a contact hole. The gate of driving transistor T2 is an electrode 17. Electrode 17 is connected to an electrode 14 through an electrode 18 and a contact hole.

One end of compensation transistor T3 is connected to anode electrode 16 through a contact hole. Another end of compensation transistor T3 is connected to electrode 14 through an electrode 18 and a contact hole. The gate of compensation transistor T3 is connected to wiring GC through the contact hole. The electrode 10 partially overlaps electrode 11, electrode 12, and electrode 14.

Figure 4:
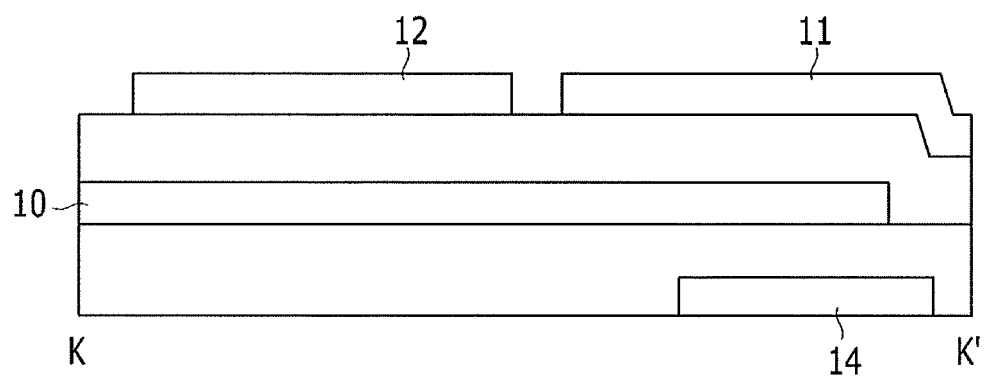
FIG. 4 illustrates a view taken along section line K-K' of FIG. 3.

FIG. 4 illustrates a cross-sectional view taken along line K-K' of FIG. 3. As illustrated in FIG. 4, first capacitor C1 is formed by electrodes 10 and 14 overlapping each other. The second capacitor C2 is formed by electrode 10 and electrodes 11 and 12 overlapping each other. An insulating layer, or interlayer insulating layer, may be formed between electrode 14 and electrode 10 and between electrode 10 and electrodes 11 and 12.

Wiring 20 serves as a gate of the switching transistor of subpixel 3. The switching transistor of subpixel 3 may be directly connected to data line D3 through the contact hole.

When the data lines are not arranged on respective sides but are arranged on one side, a longer electrode than electrode 19 may connect switching transistor T1 of subpixel 2 to data line D6. For example, when data lines are arranged on the right side of FIG. 3, electrode 19 may overlap data lines D1, D2 and D3, unlike in FIG. 3. However, as illustrated in FIG. 3, electrode 19 may overlap only data lines D4 and D5 in one embodiment. Thus, interference between the data lines may be reduced or minimized.

Figure 5:
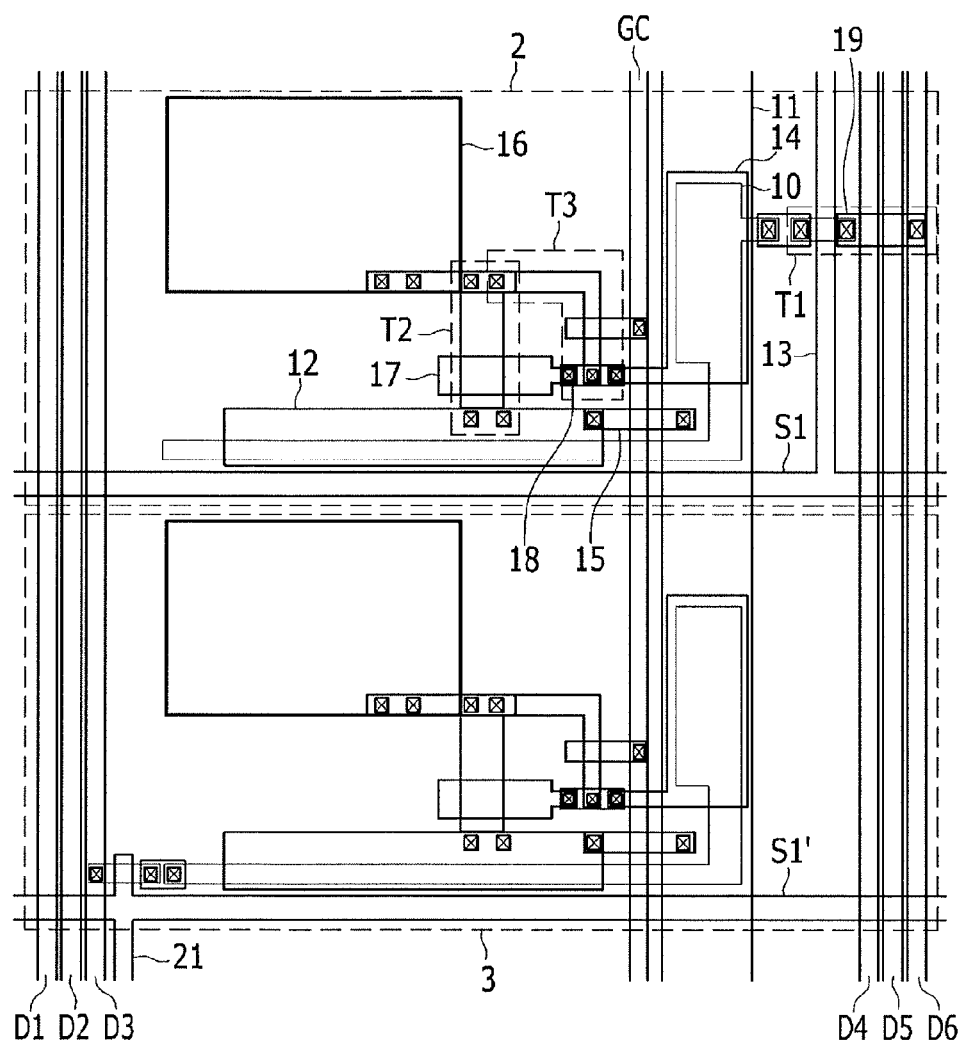
FIG. 5 illustrates an embodiment which includes an added scanning line.

FIG. 5 illustrates an embodiment which includes an added scanning line S1'. By adding scanning line S1', wiring 21 is formed in a vertical direction, instead of wiring 14 illustrated in FIG. 3. The scanning signal transmitted to three subpixels SPX connected to scanning line S1 may be equal to a scanning signal transmitted to three subpixels SPX connected to scanning line S1'. The scanning signal transmitted through scanning line S1' may be delayed by a predetermined period (e.g., one horizontal period) from the scanning signal transmitted through scanning line S.

Wiring 13 forms the gate of switching transistor of subpixel 2, and wiring 21 forms the gate of switching transistor of the subpixel 3.

While some lines and components of the aforementioned embodiments have been shown in vertical and horizontal directions, the orientation of these lines and/or components may be reversed or may extend in other directions.

By way of summation and review, in accordance with one or more of the aforementioned embodiments, a display device includes at least two subpixels arranged in a first direction; a first data line connected to a first subpixel of the two subpixels; and a second data line connected to a second subpixel of the two subpixels. The first data line is arranged at a first side of the two subpixels and the second data line is arranged at a second side of the two subpixels. The first and second sides are opposing sides relative to the first and second subpixels. Through this arrangement, parasitic capacitance between adjacent data lines may be reduced or eliminated.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A display device, comprising:
   a first pixel including at least two first subpixels arranged in a first direction;
   a second pixel including at least two second subpixels in the first direction;
   a plurality of first data lines connected to the first subpixels; and
   a plurality of second data lines connected to the second subpixels, wherein connections between the first data lines and the first subpixels are arranged at a first side of the first subpixels and connections between the second data lines and the second subpixels are arranged at a second side of the second subpixels and wherein the first and second sides are opposing sides relative to the first and second subpixels.

2. The display device as claimed in claim 1, further comprising:
   a first scanning line between the first and second subpixels in a second direction perpendicular to the first direction.

3. The display device as claimed in claim 2, further comprising:
   a first wiring extending in the first direction and connected to the first scanning line, wherein the first wiring forms a gate of a switching transistor of the first subpixel.

4. The display device as claimed in claim 3, further comprising:
   a second wiring extending in the first direction and connected to the first scanning line, wherein the second wiring forms a gate of a switching transistor of the second subpixel.

5. The display device as claimed in claim 4, wherein the first wiring and the second wiring are positioned in a diagonal direction.

6. The display device as claimed in claim 2, further comprising:
   a second scanning line between the first and second subpixels in a second direction perpendicular to the first direction.

7. The display device as claimed in claim 6, further comprising:
   a first wiring extending in the first direction and connected to the scanning line; and
   a second wiring extending in the first direction and connected to the another scanning line.

8. The display device as claimed in claim 1, wherein each of the first and second subpixels includes:
   an organic light emitting diode;
   a driving transistor to supply current to the organic light emitting diode;
   a switching transistor having one end connected to the first data line; and
   a second capacitor between a first electrode connected to another end of the switching transistor and a second electrode receiving a power supply voltage.

9. The display device as claimed in claim 8, wherein each of the first and second subpixels includes a first capacitor between the first electrode and a third electrode connected to a gate of the driving transistor.

10. The display device as claimed in claim 8, wherein each of the first and second subpixels includes:
    a compensation transistor to compensate for a threshold voltage of the driving transistor; and
    a compensation control line connected to a gate of the compensation transistor.

11. A display apparatus, comprising:
    a first pixel including a plurality of first subpixels;

a second pixel including a plurality of second subpixels adjacent the first pixel;

a plurality of first signal lines on a first side of the first and second subpixels; and a plurality of second signal lines on a second side of the first and second subpixels, wherein the first and second sides are opposing sides relative to the first and second subpixels and wherein the first signal lines are coupled to the first subpixels but not the second subpixels and the second signal lines are coupled to the second subpixels but not the first subpixels.

12. The display apparatus as claimed in claim 11, wherein the first and second signal lines are data lines.

13. The display apparatus as claimed in claim 11, further comprising a control line coupled to the first and second subpixels.

14. The display apparatus as claimed in claim 13, wherein the control line is a scanning line.

15. The display apparatus as claimed in claim 13, wherein the control line extends between the first and second subpixels.

16. A display device, comprising:
a first column of pixels;
a second column of pixels adjacent the first column; and
N data lines extending between the first and second columns, wherein each pixel in the first column includes at least two subpixels, and the at least two subpixels in adjacent pixels in the first column are coupled to a signal line, wherein each pixel in the second column includes at least two subpixels, and the at least two subpixels in adjacent pixels in the second column are coupled to the signal line, and wherein each of the at least two subpixels in a first one of the adjacent pixels in the first column is coupled to a respective one of the data lines between the first and second columns, and each of the at least two subpixels in a second one of the adjacent pixels in the second column is coupled to a different respective one of the data lines between the first and second columns.

17. The display device as claimed in claim 16, wherein the at least two subpixels in the first one of the adjacent pixels in the first column are arranged diagonally relative to the at least two subpixels in the second one of the adjacent pixels in the second column.

18. The display device as claimed in claim 17, wherein the at least two subpixels in a first one of the adjacent pixels in the second column are not coupled to any of the N data lines.

19. The display device as claimed in claim 16, wherein the number of the at least two subpixels is M and N =2M.

20. The display device as claimed in claim 16, wherein the signal line is a scan line.

* * * * *